United States Patent
Sumi et al.

(10) Patent No.: US 7,377,032 B2
(45) Date of Patent: May 27, 2008

(54) PROCESS FOR PRODUCING A PRINTED WIRING BOARD FOR MOUNTING ELECTRONIC COMPONENTS

(75) Inventors: Shinichi Sumi, Tokyo (JP); Yutaka Iguchi, Tokyo (JP)

(73) Assignee: Mitsui Mining & Smelting Co., Ltd. (JP)

( * ) Notice: Subject to any disclaimer, the term of this patent is extended or adjusted under 35 U.S.C. 154(b) by 436 days.

(21) Appl. No.: 10/991,921

(22) Filed: Nov. 18, 2004

(65) Prior Publication Data

US 2005/0111205 A1 May 26, 2005

(30) Foreign Application Priority Data

Nov. 21, 2003 (JP) ............................. 2003-392955
Dec. 5, 2003 (JP) ............................. 2003-407811

(51) Int. Cl.
*H05K 3/02* (2006.01)

(52) U.S. Cl. .................. 29/846; 361/783; 361/779; 361/760; 29/824; 29/830; 29/831; 29/852; 174/255; 174/256; 174/257; 174/258; 174/264; 438/623; 438/624; 438/678; 438/599

(58) Field of Classification Search .......... 361/783, 361/779, 792–795; 174/255–264; 29/824, 29/830, 831, 846, 852; 438/623, 624, 678, 438/599
See application file for complete search history.

(56) References Cited

U.S. PATENT DOCUMENTS

| | | | |
|---|---|---|---|
| 4,435,611 A * | 3/1984 | Ohsawa et al. ............. 174/257 |
| 4,528,064 A * | 7/1985 | Ohsawa et al. ............. 216/18 |
| 5,906,042 A * | 5/1999 | Lan et al. ............. 29/852 |
| 6,119,338 A * | 9/2000 | Wang et al. ............. 29/852 |
| 6,165,892 A * | 12/2000 | Chazan et al. ............. 438/623 |
| 6,180,523 B1 * | 1/2001 | Lee et al. ............. 438/678 |
| 6,426,011 B1 * | 7/2002 | Katoh ............. 216/19 |
| 6,495,769 B1 * | 12/2002 | Saito et al. ............. 174/255 |
| 6,797,616 B2 * | 9/2004 | Kinsman ............. 438/667 |
| 6,828,224 B2 * | 12/2004 | Iijima et al. ............. 438/622 |

(Continued)

FOREIGN PATENT DOCUMENTS

JP 3-250988 A 11/1991

(Continued)

*Primary Examiner*—Jeremy C Norris
*Assistant Examiner*—Xiaoliang Chen
(74) *Attorney, Agent, or Firm*—The Webb Law Firm, P.C.

(57) ABSTRACT

A printed wiring board for mounting electronic components includes an insulating layer and a wiring pattern formed on one surface of the insulating layer, wherein one end portion of a filled via 4 is connected with the wiring pattern and the other end portion is overlaid with a covering layer 9 obtained by applying a conductive paste to cover at least the boundary between the filled via 4 and the insulating layer 2; alternatively, a plating resist 7 is formed at the other end portion to cover at least the boundary between the filled via 4 and the insulating layer 2, and is removed after an end portion of the filled via 4 enclosed within the plating resist 7 is plated to produce a terminal layer, thereby preventing a wet processing liquid such as a tin plating solution from leaking in between the filled via 4 and the insulating layer 2.

4 Claims, 8 Drawing Sheets

U.S. PATENT DOCUMENTS

| | | | |
|---|---|---|---|
| 7,022,412 B2* | 4/2006 | Yoshida et al. | 428/477.7 |
| 2004/0000427 A1* | 1/2004 | Wang et al. | 174/256 |
| 2005/0012217 A1* | 1/2005 | Mori et al. | 257/758 |

FOREIGN PATENT DOCUMENTS

| | | | |
|---|---|---|---|
| JP | 3250988 B2 | 7/2000 |
| JP | 3250988 B2 | 1/2002 |
| JP | 2002-344102 | 11/2002 |
| JP | 2003-124601 A | 4/2003 |
| JP | 2003-133476 A | 5/2003 |
| JP | 2003-332716 A | 11/2003 |

* cited by examiner

PROCESS FOR PRODUCING A PRINTED WIRING BOARD FOR MOUNTING ELECTRONIC COMPONENTS

FIELD OF THE INVENTION

The present invention relates to a printed wiring board for mounting electronic components that allows for the mounting of semiconductor chips such as ICs and LSIs and passive components such as capacitors and resistors on one printed wiring board. Such boards are for example film carrier tapes for the mounting of electronic components such as TAB (tape automated bonding) tapes, COF (chip on film) tapes, CSP (chip size package) tapes and BGA (ball grid array) tapes, FPC (flexible printed circuits) and rigid substrate PWB (printed wiring boards). The invention also pertains to a production process of the printed wiring board, and a semiconductor device fabricated with the printed wiring board.

BACKGROUND OF THE INVENTION

Various types of printed wiring boards are employed for mounting electronic components in liquid crystal devices of personal computers and cellular phones, and in printers. These printed wiring boards are produced by a series of steps in which at least one major surface of a flexible insulating film such as a polyimide film or a rigid insulating plate such as a glass epoxy plate is overlaid with a conductive metal layer, the conductive metal layer is coated with a photosensitive resin, the photosensitive resin is photoexposed and patterned in desired configuration, the conductive metal layer is etched using the photopatterned resin as a mask to create a wiring pattern of the conductive metal, a solder resist is applied on the wiring pattern except terminals (inner leads) that make contact with electronic components mounted thereon and terminals (outer leads) that are in communication with the inner leads and are connected with the outside, the solder resist is cured, and the inner and outer leads are plated with tin or the like.

On the thus-prepared printed wiring board for mounting electronic components, a semiconductor chip is placed such that the bump electrodes formed on the chip are contacted with the inner leads, and the bump electrodes and the inner leads are electrically connected using a bonding tool. Mounting of an electronic component on the printed wiring board is thus accomplished.

In recent years, semiconductor devices are used in which semiconductor chips such as ICs and LSIs and passive components such as capacitors and resistors are mounted on one printed wiring board (see, for example, JP-A-2003-124601).

Miniaturization and weight reduction of electronic equipment have created demands for higher mounting density of electronic components. In the semiconductor devices, increasing the mounting density results in intersection of wirings among the mounted components, and therefore the electrical connection of these components by wirings can not be accomplished. To overcome such problems, double-sided printed wiring boards have been employed such as 2 metal TAB tapes and 2 metal FPC in which wiring patterns are provided on both surfaces of an insulating layer and the patterns on the both surfaces are connected through vias in a highway crossing configuration.

The double-sided printed wiring boards, however, have high costs because wiring patterns must be formed on one surface and then the other. Therefore, it has been worked out for increasing the mounting density that a wiring pattern is created only on one surface of the insulating layer, and a component is mounted on the reverse surface of the wiring pattern-formed surface through a via when the connections will cross one another.

In an etching treatment for forming a wiring pattern or a tin or gold plating treatment, however, an etching or a plating solution or a rinse liquid for removing the treatment solution leaks in a gap between the filled via and the insulating layer. The acidic plating solution or the like remained in the gap can leak out therefrom in the post processes, or such residual liquid evaporates and expands with heat applied when bonding a semiconductor chip or applied in the other process, resulting in a small explosion.

The present invention solves the aforesaid problems of the background art. It is therefore an object of the invention to provide a printed wiring board for mounting electronic components which includes an insulating layer and a wiring pattern formed on one surface of the insulating layer and in which an electronic component can be mounted on the reverse surface of the wiring pattern-formed surface through a filled via, wherein a wet processing liquid such as an etching or a plating solution is prevented from leaking in a gap between the filled via and the insulating layer. The invention also provides a production process for making the printed wiring board as well as a semiconductor device fabricated using the printed wiring board.

SUMMARY OF THE INVENTION

A printed wiring board for mounting electronic components according to the present invention comprises an insulating layer and a wiring pattern of a conductive metal that is formed on one surface of the insulating layer, wherein a through-hole perforating the insulating layer and the wiring pattern is filled with an implanting conductive material to form a filled via, one end portion of the filled via is connected with the wiring pattern, and the other end portion of the filled via is overlaid with a covering layer obtained by applying a conductive paste to cover at least the boundary between the filled via and the insulating layer.

Preferably, a deposited coating layer by plating with a conductive metal is formed over the covering layer. Also preferably, a deposited coating layer by plating with the conductive metal is formed over an end portion of the filled via on the wiring pattern side to cover at least the boundary between the filled via and the wiring pattern.

A printed wiring board for mounting electronic components according to the present invention comprises an insulating layer and a wiring pattern of a conductive metal that is formed on one surface of the insulating layer, wherein a through-hole perforating the insulating layer and the wiring pattern is filled with an implanting conductive material to form a filled via, one end portion of the filled via is connected with the wiring pattern, and a deposited terminal layer is formed on a central area of the other end portion of the filled via.

Preferably, the deposited terminal layer is formed on a deposited coating layer formed on a central area of the end portion of the filled via. Also preferably, a deposited coating layer is formed over an end portion of the filled via on the wiring pattern side to cover at least the boundary between the filled via and the wiring pattern.

The printed wiring boards of the present invention can prevent leakage of a wet processing liquid such as an etching or a plating solution or a rinse liquid for the processing liquid into a gap between the filled via and the insulating layer. Accordingly, high quality semiconductor devices may be produced in high yields.

A semiconductor device according to the present invention is fabricated using any of the printed wiring boards as described above. In the semiconductor device, a semiconductor chip and/or a passive component (electronic component) can be mounted on the reverse surface of the wiring pattern-formed surface.

In the semiconductor device fabricated using the printed wiring board in which the deposited terminal layer is formed on the end portion of the filled via, it is preferred that a semiconductor chip and/or a passive component is mounted on the reverse surface of the wiring pattern-formed surface, and that, in the end portion of the filled via on the side where the semiconductor chip and/or the passive component is bonded, an outer periphery of the central area in which the deposited terminal layer is formed is coated with solder to cover at least the boundary between the filled via and the insulating layer.

In the semiconductor device of the invention, a wiring pattern is provided on one surface and electronic components are mounted on both surfaces of the printed wiring board. Accordingly, the semiconductor device has low production costs and high packaging density. Further, as a result that the outer periphery of the end portion of the filled via connected with the electronic components, and the insulating layer are covered with solder, the implanting material is reinforced and is prevented from removing from the via hole (through-hole).

A process for producing a printed wiring board for mounting electronic components according to the present invention is for fabricating a printed wiring board comprising an insulating layer and a wiring pattern of a conductive metal that is formed on one surface of the insulating layer, the process comprising:

perforating an insulating layer and a wiring pattern or a conductive metal layer for forming a wiring pattern, and filling the resultant via hole with an implanting conductive material to form a filled via;

applying a conductive paste to an end portion of the filled via on the reverse side of the side where the wiring pattern or the conductive metal layer is formed, to form a covering layer which covers at least the boundary between the filled via and the insulating layer; and plating the covering layer with a conductive metal.

In one embodiment of the above production process, the covering layer may be plated with a conductive metal in a manner such that the wiring pattern or the conductive metal layer is simultaneously plated with the conductive metal to cover at least the boundary between the filled via and the wiring pattern or the conductive metal layer.

Another process for producing a printed wiring board for mounting electronic components according to the present invention is for fabricating a printed wiring board comprising an insulating layer and a wiring pattern of a conductive metal that is formed on one surface of the insulating layer, the process comprising:

perforating an insulating layer and a wiring pattern or a conductive metal layer for forming a wiring pattern, and filling the resultant via hole with an implanting conductive material to form a filled via;

forming a plating resist at an end portion of the filled via on the reverse side of the side where the wiring pattern or the conductive metal layer is formed, to cover at least the boundary between the filled via and the insulating layer;

plating the end portion of the filled via enclosed within the plating resist to produce a terminal layer; and removing the plating resist.

The processes preferably comprise plating an end portion of the filled via on the wiring pattern or conductive metal layer side to cover at least the boundary between the filled via and the wiring pattern or the conductive metal layer.

In one embodiment of the above production process, the end portion of the filled via enclosed within the plating resist may be plated with a conductive metal in a manner such that the wiring pattern or the conductive metal layer is simultaneously plated with the conductive metal to cover at least the boundary between the filled via and the wiring pattern or the conductive metal layer.

The processes for producing a printed wiring board of the invention enable prevention of leakage of a wet processing liquid such as an etching or a plating solution or a rinse liquid for the processing liquid in a gap between the filled via and the insulating layer.

BRIEF DESCRIPTION OF THE DRAWINGS

FIGS. 2(a) and 2(b) are a set of sectional views illustrating a step of making a filled via with molds, in which FIG. 2(a) shows a state before an implanting conductive material is filled by a punch and FIG. 2(b) shows a filled state;

DETAILED DESCRIPTION OF THE INVENTION

Hereinbelow, embodiments of the present invention will be described with reference to the drawings. The printed wiring boards for mounting electronic components of the invention include film carrier tapes such as TAB (tape automated bonding) tapes, COF (chip on film) tapes, CSP (chip size package) tapes and BGA (ball grid array) tapes, FPC (flexible printed circuits) and rigid substrate PWB (printed wiring boards). The printed wiring boards are mainly designed for mounting a semiconductor chip such as IC or LSI together with a passive component such as a capacitor or a resistor on one printed wiring board. The printed wiring board includes a long, sheet-like or plate-like insulating layer, and a wiring pattern of a conductive metal formed on one surface of the insulating layer. For example, a plurality of wiring patterns is created along the longitudinal direction or along the longitudinal and crosswise directions of the insulating layer.

Figure 1:
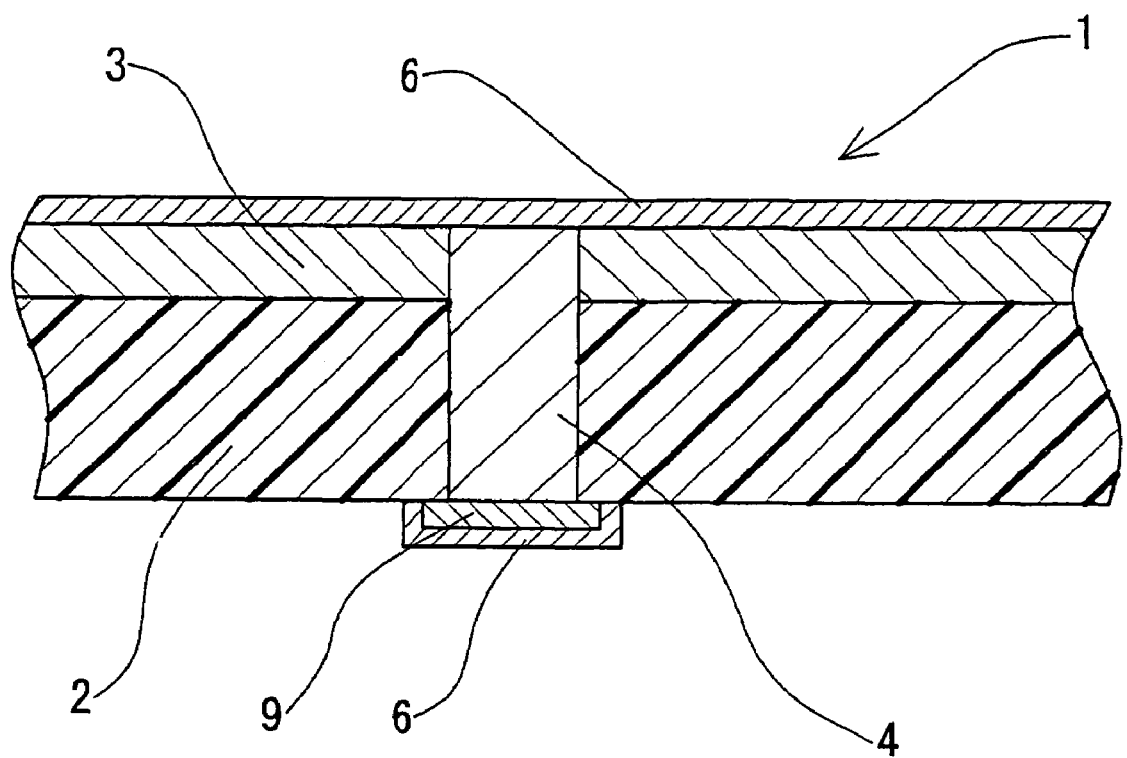
FIG. 1 is a partial sectional view of a printed wiring board for mounting electronic components according to an embodiment of the invention.

FIG. 1 is a partial sectional view of the printed wiring board for mounting electronic components according to an embodiment of the invention. As illustrated, a wiring pattern 3 is formed on one surface of an insulating layer 2 on which a semiconductor chip, a passive component or the like will be mounted. In a printed wiring board 1 for mounting electronic components, a through-hole perforating the insulating layer 2 and the wiring pattern 3 is created at a predetermined position, and the hole is filled with an implanting conductive material to form a filled via 4. The filled via 4 connects an electronic component mounted on the reverse surface of the surface on which the wiring pattern 3 is formed.

One end portion of the filled via 4 is electrically connected with the wiring pattern 3. The other end portion is overlaid with a covering layer 9 formed by applying a conductive paste to cover at least the boundary between the filled via 4 and the insulating layer 2. The covering layer 9 is overlaid with a deposited coating layer 6 of a conductive metal such as copper. The deposited coating layer 6 will be plated with tin or the like and thereafter is brought into contact with a terminal of a semiconductor chip or the like.

The insulating layer 2 employed in the invention desirably has chemical resistance against chemicals such as acids used in etching, and has heat resistance whereby it will not deteriorate by heat applied in bonding. The materials for making the insulating layer 2 include glass epoxy, bismaleimide-triadine, polyester, liquid-crystal polymer, polyamide and polyimide. In particular, the present invention preferably employs a flexible polyimide film.

The polyimide resins include wholly aromatic polyimides synthesized from pyromellitic dianhydrides and aromatic diamines, and wholly aromatic polyimides with a biphenyl skeleton synthesized from biphenyltetracarboxylic dianhydrides and aromatic diamines. The insulating layer 2 for use in the present invention generally range in thickness from 12.5 to 125 µm, and preferably from 25 to 75 µm.

In the case of a film carrier tape, the insulating layer 2 may be perforated by a punching device to attain necessary through-holes such as sprocket holes or slits.

The wiring pattern 3 may be produced by a series of steps in which a photosensitive resin is applied on a conductive metal layer overlaid on one surface of the insulating layer 2, the photosensitive resin is photoexposed to produce a desired pattern, and the conductive metal layer is etched using the photopatterned resin as a mask. The mask will be removed by alkali cleaning.

The wiring pattern may be also produced by additive or semi-additive method. The wiring pattern may be created before the implanting, after the covering layer 9 (described later) has been formed, or after the covering layer 9 and the deposited coating layer 6 have been produced. To achieve a uniform thickness of the deposited coating layer 6, the wiring pattern 3 is preferably created after the covering layer 9 and the deposited coating layer 6 have been formed.

The wiring pattern 3 is made of a conductive metal such as copper or aluminum. The conductive metal layer may be obtained by bonding an electrodeposited copper foil or a rolled copper foil, or by sputtering a metal deposit on a surface-roughed insulating layer, followed by electrolytic copper plating to thickly cover with copper. The wiring pattern formed may be overall electroless tin plated to prevent oxidation on the conductive wiring.

Figure 2A:
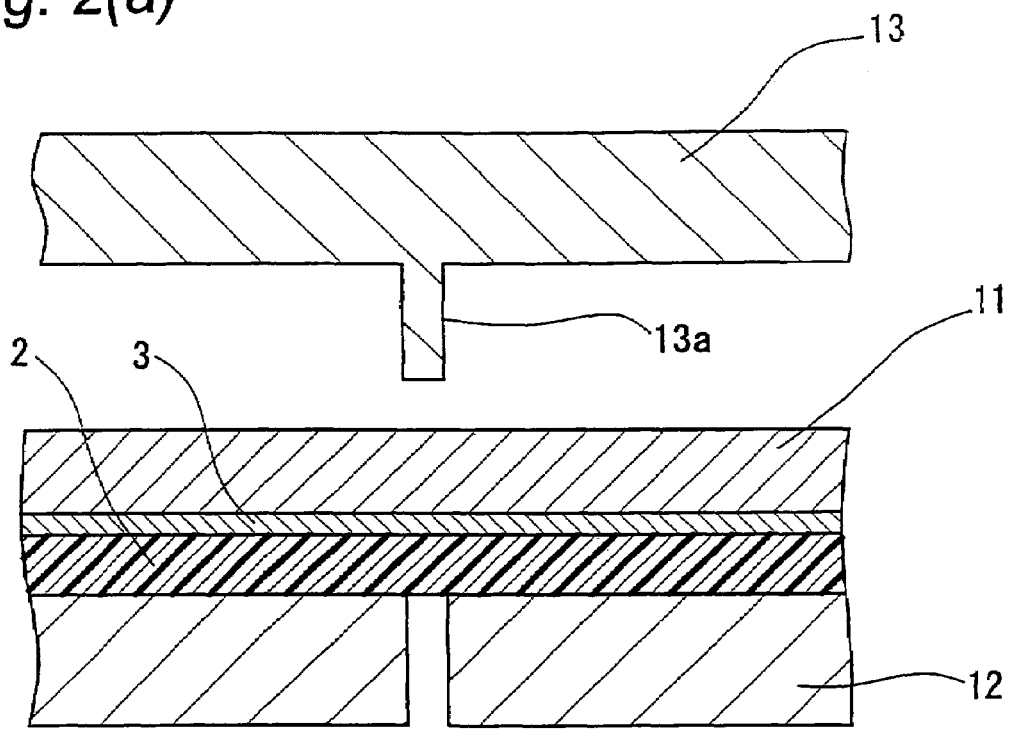
Figure 2B:
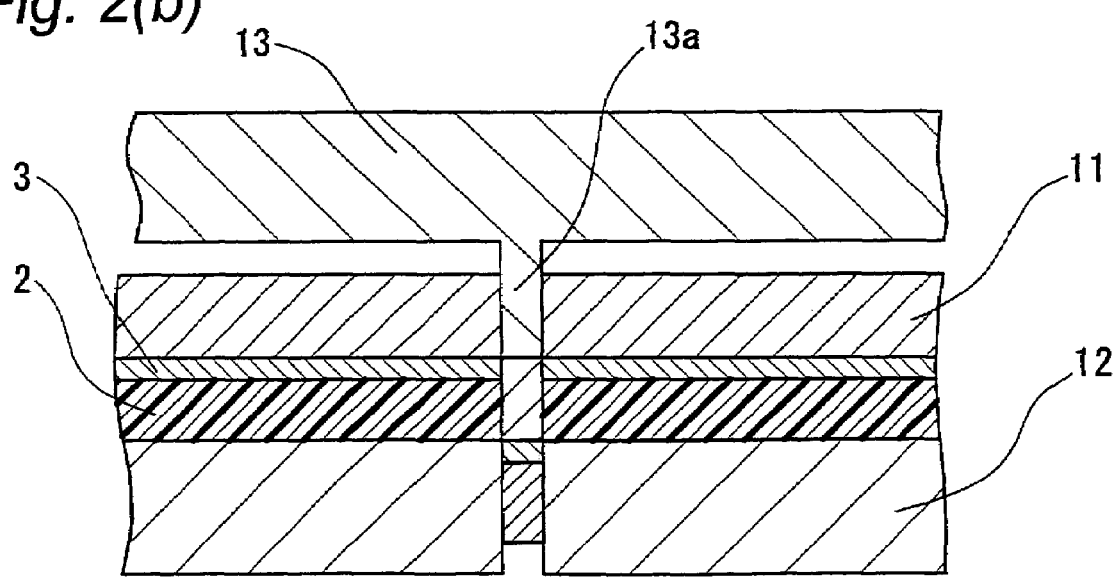

The filled via 4 may be produced by pressing using a set of molds which includes a male mold with a punch and a female mold with a die aperture corresponding to the punch (see Japanese Patent No. 3250988). Specifically, as illustrated in FIG. 2, a conductive metal sheet 11 made of an implanting conductive material such as copper is overlaid on the insulating layer 2 on which the wiring pattern 3 has been formed (or overlaid on a laminate in which an unpatterned conductive metal layer is superposed on the insulating layer 2). These are then placed on a female mold 12 (FIG. 2(a)), and a male mold 13 is moved down to punch out the conductive metal sheet 11 and the insulating layer 2 by means of a punch 13a (FIG. 2(b)).

In the above operation, the male mold 13 will descend by a stroke such that the lower edge of the punch 13a is approximately of the same level as the lower surface of the conductive metal sheet 11. The descent is controlled to stop there and whereby only the conductive sheet 11 is perforated. As a result, the insulating layer 2 is punched out by a piece of the conductive sheet 11 that has been pressed down by the punch 13a, with formation of a through-hole. Simultaneously with formation of the through-hole, the piece is positioned within the hole and the filled via 4 is produced. Thereafter, the male mold 13 is moved up and the conductive metal sheet 11 is removed. It is also possible to produce the filled via by perforating the insulating layer 2 and the wiring pattern 3 (conductive metal layer) beforehand, then overlaying the conductive sheet 11, and punching out the conductive sheet 11 to fill a piece punched out into the via.

The filled via 4 may be also formed by punching out the insulating layer 2 with the above-described molds to create a through-hole, and pressing a conductive paste in the hole by screen printing with a metal mask having an aperture corresponding to the through-hole, and a squeezee.

The width of the filled via 4 in a transverse direction is generally from 20 to 2000 µm, preferably from 70 to 1000 µm, and more preferably from 80 to 200 µm. The shape of the horizontal cross section of the filled via is arbitrary, and may be for example a round, elliptical, square or hexagonal shape.

The conductive paste used for forming the covering layer 9 may be a dispersion of metal powder such as of silver or copper, carbon powder, or a mixture thereof, in an organic solvent in which a binder resin such as a thermosetting resin and optionally a curing agent are dissolved. Examples of the conductive pastes include those used for bonding a semiconductor chip terminal such as of IC or LSI with a lead wire of a printed wiring board.

The conductive paste is applied by screen printing, a dispenser or stamping, then dried and where necessary cured by heating to give the covering layer (pad) 9. The covering layer 9 is formed in arbitral size and shape to cover at least the boundary between the filled via 4 and the insulating layer 2 to prevent leakage of a tin or gold plating solution or the like in a gap between the filled via 4 and the insulating layer 2.

The deposited coating layer 6 is produced over the covering layer 9 by electrolytic or electroless plating with the same conductive metal as of the wiring pattern 3, for example copper. The deposited coating layer enables secure seal of the boundary between the filled via 4 and the insulating layer 2. The plating may be performed in a manner such that a deposited coating layer 6 is formed also on the wiring pattern 3 to securely seal the boundary between the filled via 4 and the wiring pattern 3. The deposited coating layers 6 generally range in thickness from 0.1 to 20 μm, and preferably from 1 to 6 μm.

Figure 3:
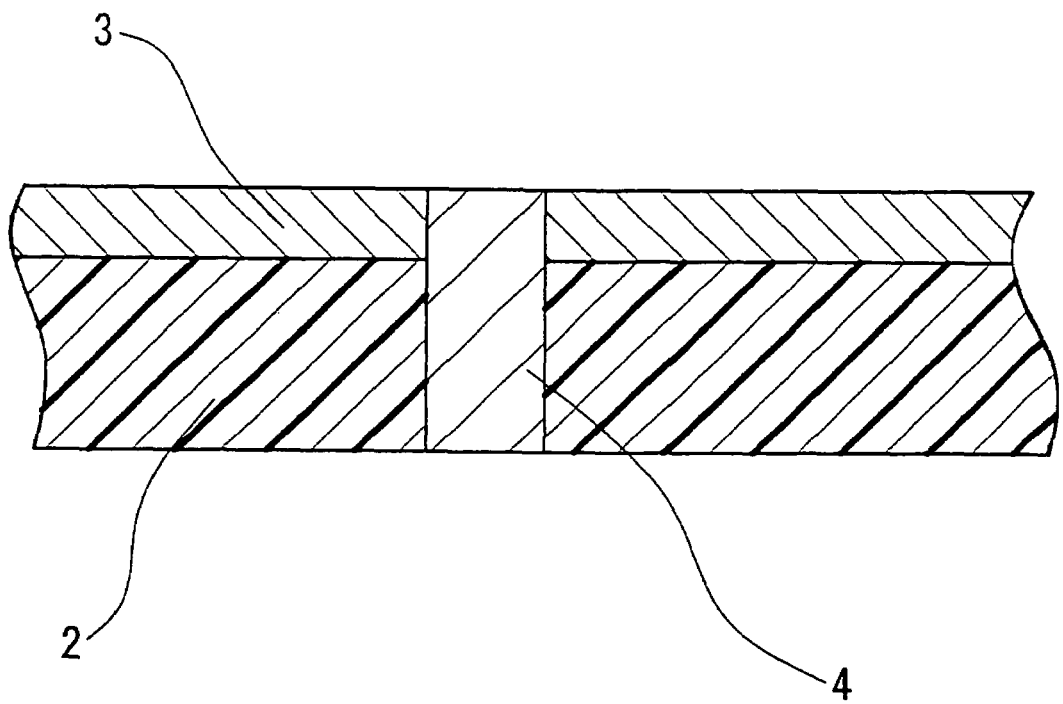
FIG. 3 is a sectional view of the filled via perforating an insulating layer and a wiring pattern.
Figure 5A:
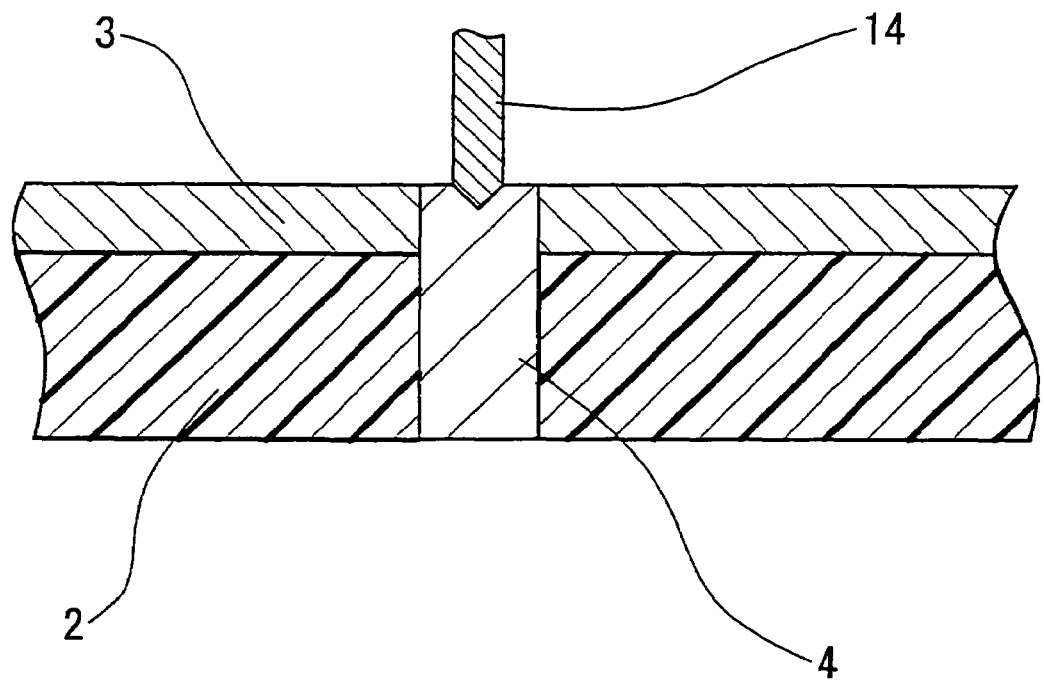
FIG. 5(a) is a partial sectional view illustrating the filled via in which a caulking punch is driven into an end portion on the wiring pattern side.
Figure 5B:
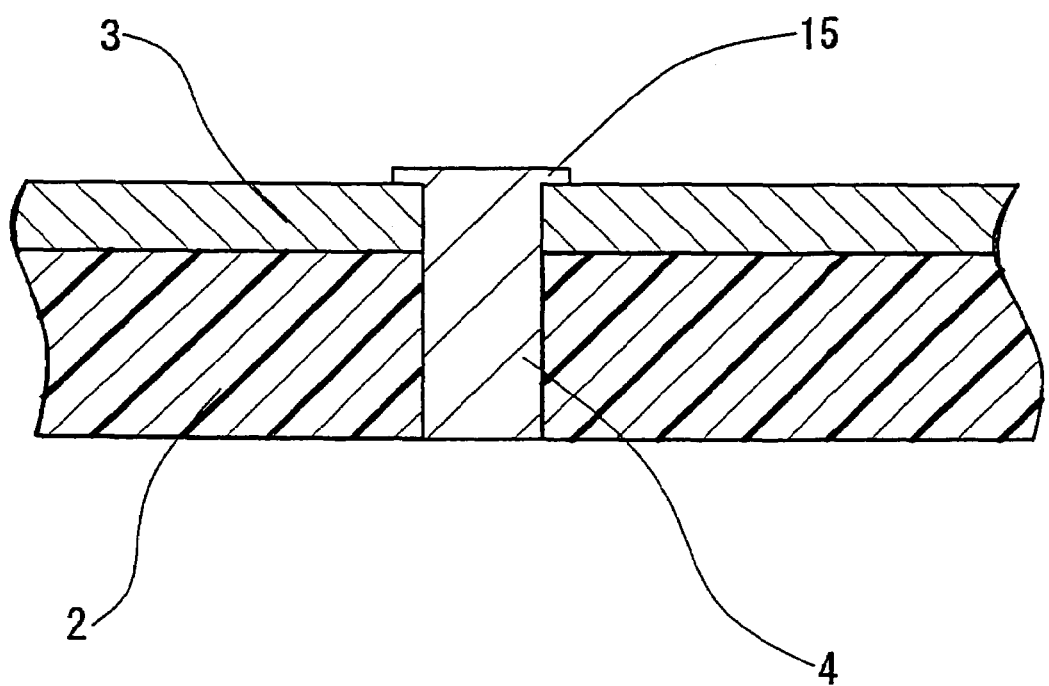
FIG. 5(b) is a sectional view showing the filled via in which a caulking part 15 is formed at an end portion on the wiring pattern side.

Hereinbelow, a process of producing the wiring board for mounting electronic components of the above embodiment will be described in the order of steps. First, the insulating layer 2 and the wiring pattern 3 or the conductive metal layer to be etched for forming the wiring pattern 3, are perforated by the method as described above; the through-hole is filled with the implanting conductive material to produce the filled via 4 (FIG. 3). When the filled via 4 has been produced using the conductive metal sheet 11 as illustrated in FIG. 2, a caulking punch 14 may be driven into an end portion of the filled via 4 on the wiring pattern 3 side, thereby to expand the end portion outward as shown in FIG. 5(*a*). The caulking punches are provided at positions corresponding to each of the filled vias. Alternatively, as illustrated in FIG. 5(*b*), the implanting conductive material may be slightly protrudent from the through-hole to form a caulking part 15 at the end portion. The caulking punch or part ensures connection between the filled via 4 and the wiring pattern 3 and prevents a wet processing liquid such as a tin or gold plating solution from leaking into the boundary.

Figure 4:
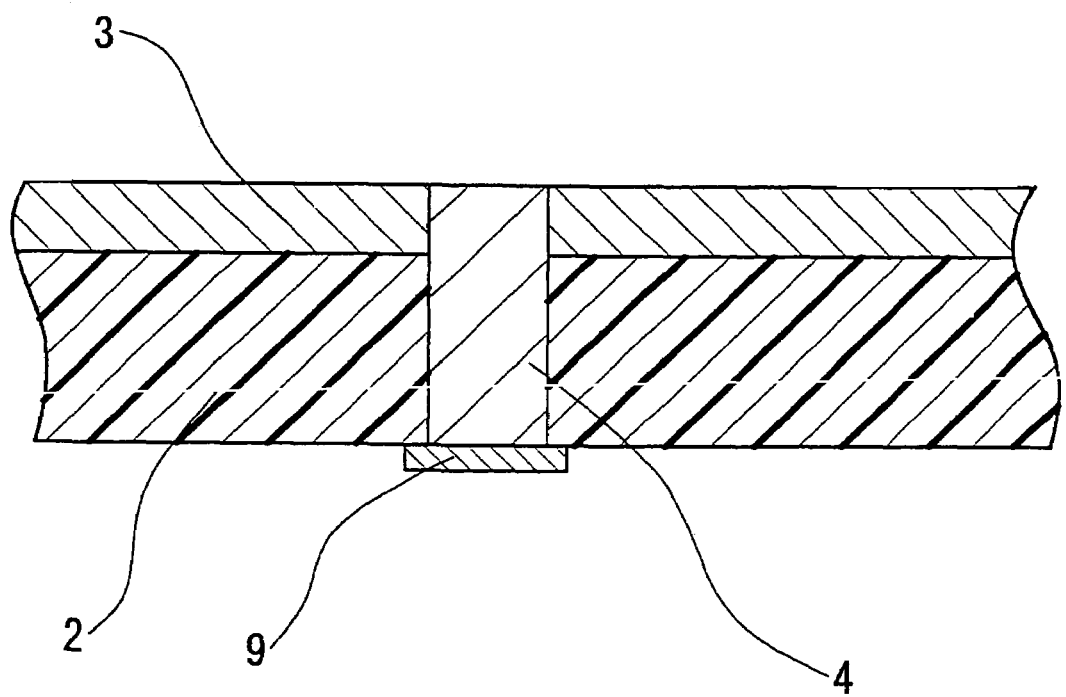
FIG. 4 is a sectional view illustrating a covering layer obtained by application of a conductive paste.

Subsequently, a metal mask perforated at a position corresponding to the filled via 4 is arranged above the insulating layer 2, and the conductive paste is extruded onto the filled via 4. In one embodiment, the conductive paste may be extruded onto the filled via 4 while moving a squeezee over the metal mask. As a result, the conductive paste is applied on the end portion of the filled via 4 on the reverse side of the wiring pattern 3 (or the conductive metal layer), to cover at least the boundary between the filled via 4 and the insulating layer 2. The paste applied is then dried or cured by heat to give the covering layer 9 (FIG. 4).

Thereafter, the insulating layer 2 in which the filled via 4 is overlaid with the covering layer 9, is subjected to electrolytic or electroless copper plating to produce the deposited coating layer 6 (FIG. 1).

In the case where the wiring pattern 3 has not been formed, the conductive metal layer is patterned into the wiring pattern 3 by a photolithographic method. Where necessary, the wiring pattern is plated overall by electroless tin plating. Thereafter, a predetermined area of the wiring pattern 3 and a surface of the deposited coating layer 6 are plated with, for example, tin to form terminals that can be stably bonded with semiconductor chip terminals by forming eutectic with the semiconductor chip terminals.

In general, plating to form terminals is preceded by application and curing of a solder resist except over the terminals, for protecting the wiring pattern.

The deposited terminal layers formed herein may be selected appropriately in view of the bonding step that follows. Examples of the suitable deposited terminal layers include those of tin, gold, solder and nickel, and composite layers thereof. The plating may be accomplished by electrolytic plating or electroless plating depending on the conditions. The deposited layers generally have a thickness of 0.1 to 10 μm, and preferably 0.2 to 7 μm. Where necessary, a gold bump may be formed on the tin deposit layer.

The printed wiring board for mounting electronic components according to the present invention may be fabricated as described above. Thereafter, a semiconductor chip and a passive component are mounted on the wiring pattern 3, and a semiconductor chip and a passive component are mounted on the reverse surface of the surface with the wiring pattern 3 by connecting their terminals to the respective deposited terminal layers. A semiconductor device may be thus produced.

Figure 6:
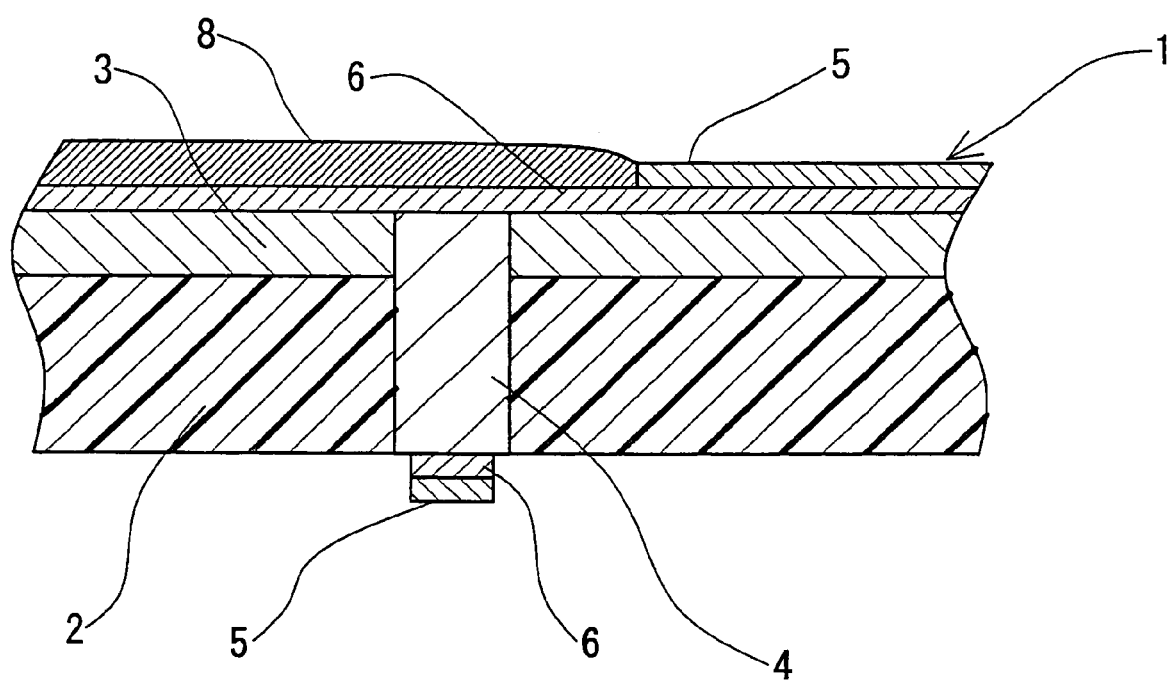
FIG. 6 is a partial sectional view of a printed wiring board for mounting electronic components according to another embodiment of the invention.

FIG. 6 is a sectional view of the printed wiring board for mounting electronic components according to another embodiment of the invention. As illustrated, the wiring pattern 3 is formed on one surface of the insulating layer 2 on which a semiconductor chip, a passive component or the like will be mounted. At a predetermined position of the printed wiring board 1, a hole is created through the insulating layer 2 and the wiring pattern 3 and is filled with an implanting conductive material to form the filled via 4. The filled via 4 connects an electronic component mounted on the reverse surface of the surface on which the wiring pattern 3 is formed. The numeral 6 indicates a deposited coating layer of a conductive metal that covers at least the boundary between the filled via and the wiring pattern 3. The numeral 8 is a solder resist layer.

One exposed end portion of the filled via 4 is electrically connected with the wiring pattern 3. The other exposed end portion of the filled via is plated with tin or the like in a central area to have a deposited terminal layer 5, with which a terminal of a semiconductor chip or the like will be connected.

Figure 7:
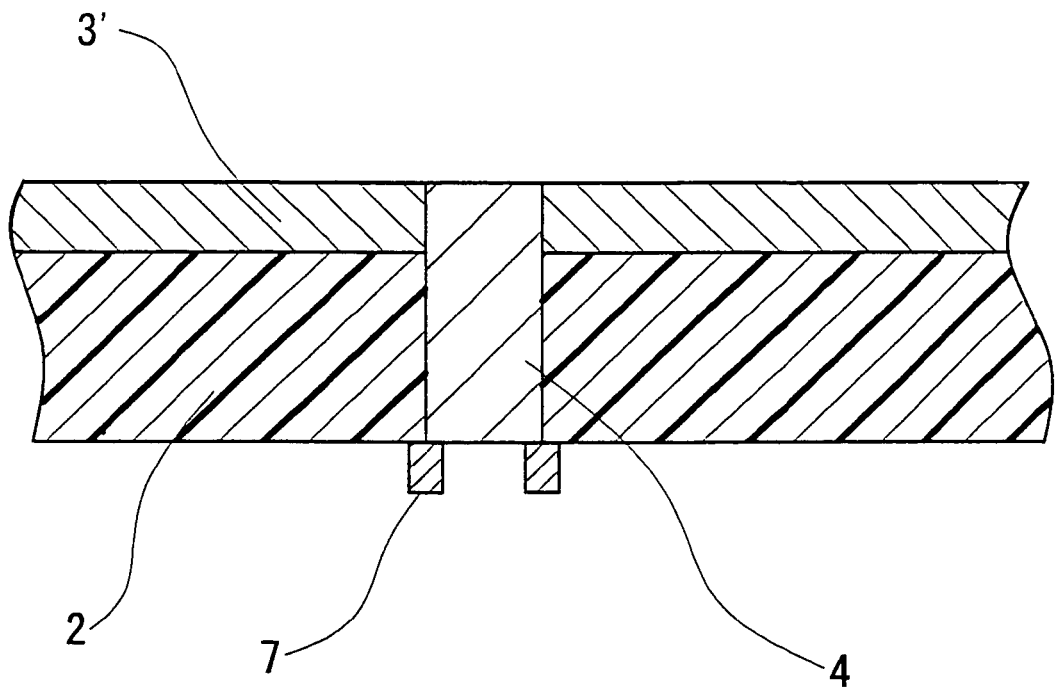
FIG. 7 is a sectional view illustrating a plating resist formed at an end portion on the insulating layer side of the filled via perforating the insulating layer and the conductive metal layer.
Figure 8:
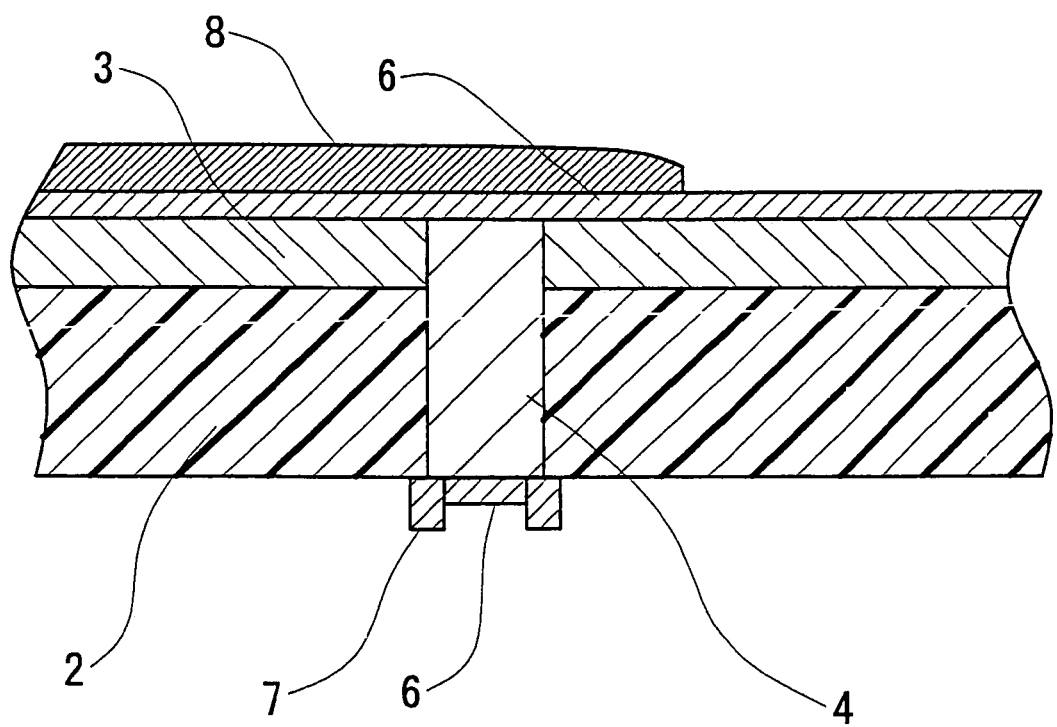
FIG. 8 is a sectional view of the structure illustrated in FIG. 7 that is further overlaid with a deposited coating layer and a solder resist layer and in which the conductive metal layer is patterned into a wiring pattern.
Figure 9:
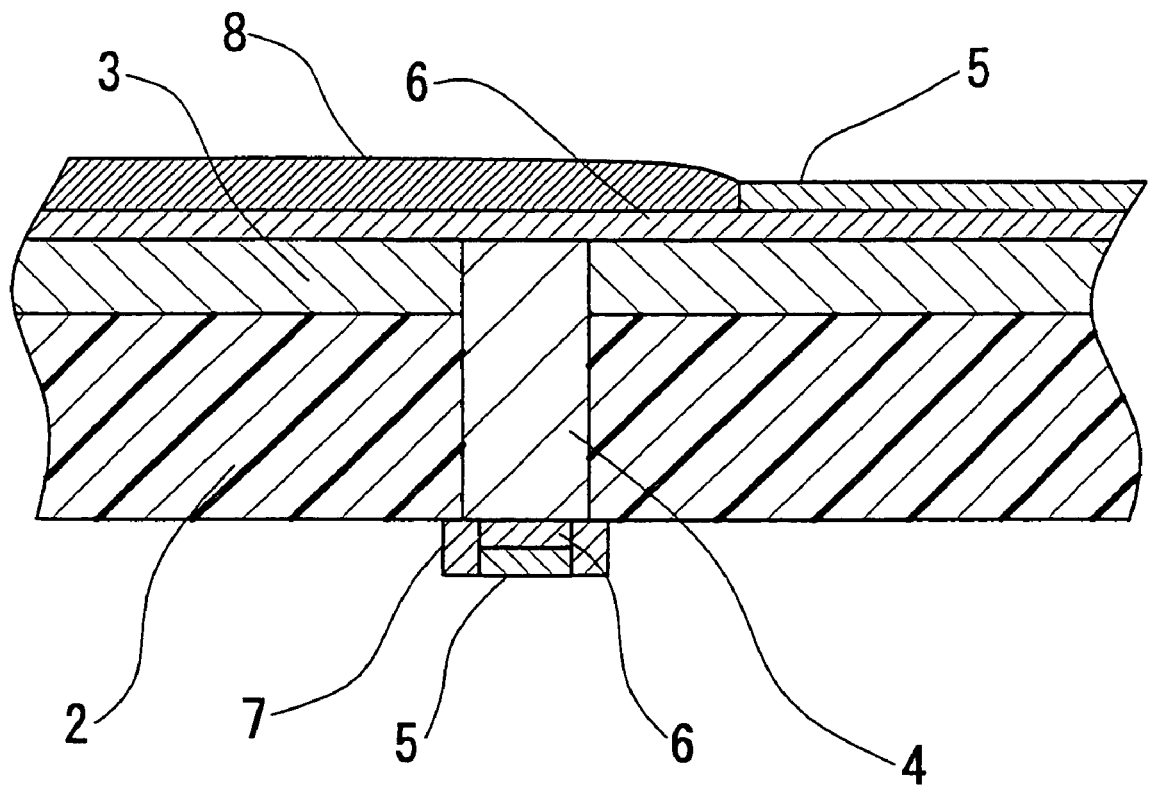
FIG. 9 is a sectional view illustrating a deposited terminal layer enclosed within the plating resist at an end portion of the filled via.

When the exposed end portion of the filled via 4 on the reverse side of the wiring pattern 3 or the conductive metal layer is plated with tin, gold or the like to attain a deposited terminal layer, the plating solution such as tin or gold plating solution used herein is likely to leak in between the filled via 4 and the insulating layer 2. The same problem occurs with an acidic wet processing liquid such as an etching solution. The present embodiment prevents this problem by providing a plating resist 7 over the boundary between the filled via 4 and the insulating layer 2, as illustrated in FIGS. 7 to 9.

The plating resist 7 is applied to a predetermined position by screen printing or a like method. The plating resist is shaped arbitrarily such that it covers at least the boundary between the filled via 4 and the insulating layer 2 to prevent the plating solution or the like from leaking in between the filled via 4 and the insulating layer 2, and also such that a part of the end portion surface of the filled via 4 remains exposed to allow for formation of the deposited terminal layer. In general, the plating resist 7 is produced with a hollow cross section such that an inner part of the filled via surface enclosed within the plating resist 7 is exposed for formation of the deposited terminal layer. For example, when the filled via 4 has a circular cross section, the plating resist 7 is shaped like a ring.

The plating resist 7 may be a commercially available screen printable resist. The plating resist should be selected such that it will not dissolve in an acidic wet processing liquid such as a plating or an etching solution, or a rinse liquid for the processing liquid. The plating resist 7 is removed after the wet processing is completed, for example after the deposited terminal layer is formed.

The deposited coating layer 6 is formed on the wiring pattern 3 or the conductive metal layer by electrolytic or electroless plating with the same conductive metal as of the wiring pattern 3, for example copper. By the deposited coating layer, secure seal of the boundary between the filled via 4 and the wiring pattern 3 or the conductive metal layer is achieved. The deposited coating layer 6 generally ranges in thickness from 0.1 to 20 μm, and preferably from 1 to 6 μm. To achieve a uniform thickness of the deposited coating layer 6, the wiring pattern 3 is preferably created after the deposited coating layer 6 has been produced.

Hereinbelow, a process of producing the wiring board for mounting electronic components of the above embodiment will be described in the order of steps. First, the insulating layer 2 and the conductive metal layer 3' to be etched for forming the wiring pattern 3, are perforated by the method described above; the through-hole is filled with the implanting conductive material to form the filled via 4 (FIG. 7).

Subsequently, as illustrated in FIG. 7, a metal mask perforated at a position corresponding to the filled via 4 is arranged above the insulating layer 2, and the resist coating solution is extruded onto the filled via 4 while moving a squeezee over the metal mask. As a result, the plating resist 7 is formed on the end portion of the filled via 4 on the reverse side of the conductive metal layer 3', such that the boundary between the filled via 4 and the insulating layer 2 is covered and such that an inner part of the filled via surface enclosed within the plating resist is exposed for formation of the deposited terminal layer.

After the plating resist 7 has been created, the conductive metal layer 3' is subjected to electrolytic or electroless copper plating to produce a deposited coating layer 6. In the plating, the implanting material exposed on the end portion surface of the filled via 4 on the reverse side of the wiring pattern-formed surface is also copper plated. Thereafter, the conductive metal layer 3' is patterned into a wiring pattern by a photolithographic method. Where necessary, the wiring pattern is tin plated overall by electroless tin plating.

In general, before plating is performed to form terminals, a solder resist is applied and cured except over the terminal areas, for the purpose of protecting the wiring pattern. FIG. 8 illustrates a structure in which the wiring pattern 3 is overlaid with the deposited coating layer 6 and further with the solder resist layer 8.

Subsequently, the deposited coating layer 6 on the wiring pattern 3 that is not covered with the solder resist layer 8, and the deposited coating layer 6 formed on the end portion of the filled via 4 surrounded by the plating resist 7, are plated with, for example, tin to form deposited terminal layers 5 that can be stably bonded with semiconductor chip terminals by forming eutectic with the semiconductor chip terminals.

Similarly in the aforesaid embodiment, the deposited terminal layers 5 formed herein may be selected appropriately in view of the bonding step that follows. Examples of the suitable deposits include those of tin, gold, lead-free solder and nickel, and composite layers thereof. The plating may be accomplished by electrolytic plating or electroless plating depending on the conditions. The deposited layers formed herein generally have a thickness of 0.1 to 10 µm, and preferably 0.2 to 7 µm. Where necessary, a gold bump may be formed on the tin deposit.

After the deposited terminal layer 5 has been formed, the plating resist 7 is removed by alkali cleaning or the like. The printed wiring board for mounting electronic components according to the present embodiment may be thus fabricated. Thereafter, a semiconductor chip and a passive component are mounted on the wiring pattern 3, and a semiconductor chip and a passive component are mounted on the reverse surface of the surface with the wiring pattern 3 by connecting their terminals to the respective deposited terminal layers. A semiconductor device may be thus produced.

Figure 10:
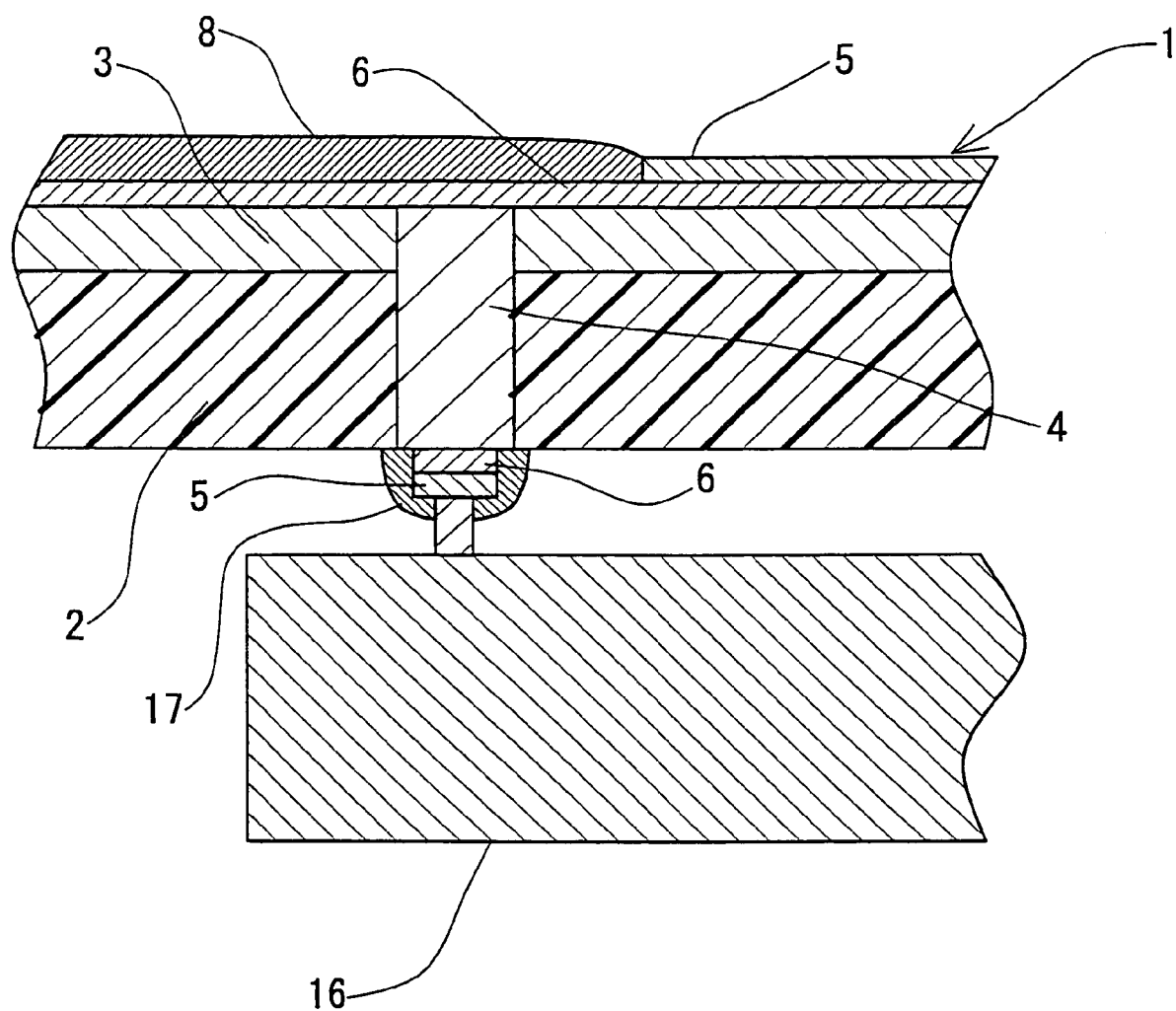
FIG. 10 is a sectional view illustrating an end portion of the filled via that is connected with a semiconductor chip and is covered with solder.

As shown in FIG. 10, a central area of the end portion of the filled via 4 is overlaid with the deposited terminal layer 5 that is bonded with a semiconductor chip 16; solder 17 (preferably lead-free solder) is applied over the outer periphery of the central area to cover at least the boundary between the filled via 4 and the insulating layer 2. As a result, the implanting material is reinforced and is prevented from removing from the via.

The present invention will be hereinafter described by Examples presented below, but it should be construed that the invention is in no way limited to those Examples.

EXAMPLE 1

A nickel alloy seed layer was sputtered on a 38 µm thick polyimide film, and copper was deposited thereon by plating in 8 µm thickness to give a two-layer COF substrate. The substrate was overlaid with a copper sheet as an implanting conductive material, and they were perforated at 50 positions per one piece of film carrier using a set of molds illustrated in FIG. 2 in a manner such that one end portion of the copper sheet punched out would connect with the copper layer of the COF substrate, thereby producing filled vias (section width: 100 µm).

A conductive copper paste (trade name: SF-19, available from Mitsui Kinzoku Paints & Chemicals Co., Ltd.) was applied by screen printing over 0.5 mm square areas which included each filled via and the adjacent polyimide film, followed by heat drying. Subsequently, the overall surface of the copper layer of the COF substrate in which the implanting material had been embedded, and the covering layers obtained by application of the copper paste were electrolytically copper plated to coat these layers with deposited copper.

Thereafter, a photoresist was applied over the film, dried, photoexposed through a patterned photomask, and then developed. Etching was performed with an acidic copper chloride aqueous solution to produce wiring patterns.

After a solder resist had been applied except over the terminal portions of the wiring pattern and been cured, the terminal portions of the wiring pattern and the copper deposit coating layers were tin plated in an electroless plating bath containing stannous fluoroborate, alkanesulfonic acid, hypophosphorous acid and so on.

The thus-produced film carrier tape for mounting electronic components was reeled and allowed to stand at ordinary temperature. After the lapse of 5 days, the areas to which the copper paste had been applied were inspected for appearance, but no abnormalities such as corrosion marks were found. Subsequently, one hundred pieces of film carrier were cut out from the film carrier tape and these were sequentially placed on a 300° C. hot plate for 10 seconds. Nothing particularly abnormal was found with the film carriers.

Thereafter, a capacitor and a resistor were mounted on the wiring pattern of the film carrier fabricated as described above. Meanwhile, a bump of an IC chip was connected with the filled via surface on the reverse side to the wiring pattern-formed surface, which filled via surface had been overlaid with the copper paste-derived layer, the deposited coating layer and the tin deposit. The components were then sealed with resin to yield a semiconductor device.

EXAMPLE 2

A 12 µm thick electrodeposited copper foil was superposed on a 25 µm thick polyimide film to give a COF substrate. A photoresist was applied to the substrate, dried, photoexposed through a patterned photomask, and then developed. Etching was performed with an acidic copper chloride aqueous solution to create wiring patterns. The substrate was then overlaid with a copper sheet as an implanting conductive material, and they were perforated using a set of molds illustrated in FIG. 2 in a manner such that one end portion of the copper sheet punched out would connect with the wiring pattern, thereby producing filled vias (section width: 100 µm).

A conductive copper paste (trade name: SF-19, available from Mitsui Kinzoku Paints & Chemicals Co., Ltd.) was applied by screen printing over 0.3 mm diameter areas which included each filled via and the adjacent polyimide film, followed by heat drying. Subsequently, the wiring pattern and the copper paste-derived covering layers were copper plated by electrolytic plating to coat these layers with deposited copper.

After a solder resist had been applied except over the terminal portions of the wiring pattern and been cured, the predetermined portions of the wiring pattern and the copper deposited coating layers were tin plated by electroless plating as described in Example 1.

The thus-produced film carrier tape for mounting electronic components was reeled and allowed to stand at ordinary temperature. After the lapse of 5 days, the areas to which the copper paste had been applied were inspected, but no abnormalities such as corrosion marks were found. Subsequently, one hundred pieces of film carrier were cut out from the film carrier tape and these were sequentially placed on a 300° C. hot plate for 10 seconds. Nothing particularly abnormal was found with the film carriers.

Thereafter, a capacitor and a resistor were mounted on the wiring pattern of the film carrier fabricated as described above. Meanwhile, a bump of an IC chip was connected with the filled via surface on the reverse side of the wiring pattern-formed surface, which filled via surface had been overlaid with the copper paste-derived layer, the deposited coating layer and the tin deposit. The components were then sealed with resin to yield a semiconductor device.

COMPARATIVE EXAMPLE 1

A film carrier tape for mounting electronic components was produced in the same manner as in Example 1, except that a covering layer was deposited without application of the copper paste. One hundred pieces of film carrier were cut out from the film carrier tape and these were inspected for appearance as described in Example 1. As a result, corrosion marks were confirmed on three pieces in the one hundred pieces of film carrier. Subsequently, the normal ninety-seven pieces of film carrier were sequentially placed on a hot plate as described in Example 1. Seven pieces of film carrier experienced a small explosion, presumably a phreatic explosion.

COMPARATIVE EXAMPLE 2

A film carrier tape for mounting electronic components was produced in the same manner as in Example 2, except that a covering layer was deposited without application of the copper paste. One hundred pieces of film carrier were cut out from the film carrier tape and these were inspected for appearance as described in Example 2. As a result, corrosion marks were confirmed on one piece in the one hundred pieces of film carrier. Subsequently, the normal ninety-nine pieces of film carrier were sequentially placed on a hot plate as described in Example 2. Six pieces of film carrier experienced a small explosion, presumably a phreatic explosion.

EXAMPLE 3

A nickel alloy seed layer was sputtered on a 38 µm thick polyimide film, and copper was deposited thereon in 8 µm thickness to give a two-layer COF substrate. The substrate was overlaid with a copper sheet as an implanting conductive material, and they were perforated at 50 positions per one piece of film carrier using a set of molds illustrated in FIG. 2 in a manner such that one end portion of the copper sheet punched out would connect with the copper layer of the COF substrate, thereby producing filled vias (section width: 200 µm).

A thermal drying plating resist (trade name: MA-830, available from TAIYO INK MFG. CO., LTD.) was applied by screen printing to the reverse surface of the surface with the copper layer of the COF substrate, along the boundary between the filled via and the adjacent polyimide film so as to seal the gap between them, followed by drying to form a plating resist.

Subsequently, the overall surface of the copper layer of the COF substrate in which the implanting material had been embedded was electrolytically copper plated to cover the boundary between the filled via and the copper layer of the COF substrate. Simultaneously, the end portion of the filled via exposed on the reverse surface and enclosed within the plating resist was electrolytically copper plated.

Thereafter, a photoresist was applied over the copper-plated copper layer of the COF substrate, then dried, photoexposed through a patterned photomask, and developed. Etching was performed with an acidic copper chloride aqueous solution to produce wiring patterns.

After a solder resist had been applied except over the terminal portions of the wiring pattern and been cured, the terminal portions of the wiring pattern and the copper deposited coating layers on the filled via end surface enclosed within the plating resist, were tin plated in an electroless plating bath containing stannous fluoroborate, alkanesulfonic acid, hypophosphorous acid and so on. Thereafter, the plating resist surrounding the copper deposited coating layer and the tin deposit was removed.

The thus-produced film carrier tape for mounting electronic components was reeled and allowed to stand at ordinary temperature. After the lapse of 5 days, the terminal portions on the reverse surface of the wiring pattern-formed surface were inspected for appearance, but no abnormalities such as corrosion marks were found. Subsequently, one hundred pieces of film carrier were cut from the film carrier tape and these were sequentially placed on a 300° C. hot plate for 10 seconds. Nothing particularly abnormal was found with the film carriers.

Thereafter, a capacitor and a resistor were mounted on the wiring pattern of the film carrier fabricated as described above. Meanwhile, a bump of an IC chip was connected with the tin-plated filled via surface on the reverse surface of the wiring pattern-formed surface. The components were then sealed with resin to yield a semiconductor device.

EXAMPLE 4

A 12 µm thick electrodeposited copper foil was superposed on a 25 µm thick polyimide film to give a COF substrate. A photoresist was applied to the substrate, dried, photoexposed through a patterned photomask, and then developed. Etching was performed with an acidic copper chloride aqueous solution to make wiring patterns. The substrate was then overlaid with a copper sheet as an implanting conductive material, and they were perforated using a set of molds illustrated in FIG. 2 in a manner such that one end portion of the copper sheet punched out would connect with the wiring pattern, thereby producing filled vias (section width: 200 μm).

The resist employed in Example 3 was applied by screen printing to the reverse surface of the wiring pattern-formed surface of the filled via, along the boundary between the polyimide film and the filled via so as to seal the gap between them, followed by drying to form a plating resist. Subsequently, electrolytic copper plating was carried out to cover the boundary between the filled via and the wiring pattern and simultaneously to plate the end portion of the filled via exposed on the reverse surface and enclosed within the plating resist.

After a solder resist had been applied except over the terminal portions of the wiring pattern and been cured, the terminal portions of the wiring pattern and the copper deposit coating layer on the filled via end surface enclosed within the plating resist, were tin plated by electroless plating as described in Example 3.

The thus-produced film carrier tape for mounting electronic components was reeled and allowed to stand at ordinary temperature. After the lapse of 5 days, the terminal portions on the reverse surface of the wiring pattern-formed surface were inspected for appearance, but no abnormalities such as corrosion marks were found. Subsequently, one hundred pieces of film carrier were cut out from the film carrier tape and these were sequentially placed on a 300° C. hot plate for 10 seconds. Nothing particularly abnormal was found with the film carriers.

Thereafter, a capacitor and a resistor were mounted on the wiring pattern of the film carrier fabricated as described above. Meanwhile, a bump of an IC chip was connected with the tin-plated filled via surface on the reverse side of the wiring pattern-formed surface. The components were then sealed with resin to yield a semiconductor device.

COMPARATIVE EXAMPLE 3

A film carrier tape for mounting electronic components was produced in the same manner as in Example 3, except that tin plating was performed without a plating resist. One hundred pieces of film carrier were cut out from the film carrier tape and these were inspected for appearance s described in Example 3. As a result, corrosion marks were confirmed on four pieces in the one hundred pieces of film carrier. Subsequently, the normal ninety-six pieces of film carrier were sequentially placed on a hot plate as described in Example 3. Ten pieces of film carrier experienced a small explosion, presumably a phreatic explosion.

COMPARATIVE EXAMPLE 4

A film carrier tape for mounting electronic components was produced in the same manner as in Example 4, except that tin plating was performed without a plating resist. One hundred pieces of film carrier were cut out from the film carrier tape and these were inspected for appearance as described in Example 4. As a result, corrosion marks were confirmed on two pieces in the one hundred pieces of film carrier. Subsequently, the normal ninety-eight pieces of film carrier were sequentially placed on a hot plate as described in Example 4. Ten pieces of film carrier experienced a small explosion, presumably a phreatic explosion.

What is claimed is:

1. A process for producing a printed wiring board for mounting electronic components which comprises an insulating layer and a wiring pattern of a conductive metal that is formed on one surface of the insulating layer, the process comprising:

perforating an insulating layer and a wiring pattern or a conductive metal layer for forming a wiring pattern, and filling a resultant via hole with an implanting conductive material to form a filled via;

applying a conductive paste to an end portion of the filled via on the reverse side of the side where the wiring pattern or the conductive metal layer is formed, to form a covering layer which covers at least the boundary between the filled via and the insulating layer; and plating the covering layer with a conductive metal.

2. The process for producing a printed wiring board for mounting electronic components according to claim 1, further comprising plating an end portion of the filled via on the wiring pattern or conductive metal layer side to cover at least the boundary between the filled via and the wiring pattern or the conductive metal layer.

3. A process for producing a printed wiring board for mounting electronic components which comprises an insulating layer and a wiring pattern of a conductive metal that is formed on one surface of the insulating layer, the process comprising:

perforating an insulating layer and a wiring pattern or a conductive metal layer for forming a wiring pattern, and filling a resultant via hole with an implanting conductive material to form a filled via;

forming a plating resist at an end portion of the filled via on the reverse side of the side where the wiring pattern or the conductive metal layer is formed, to cover at least the boundary between the filled via and the insulating layer;

plating the end portion of the filled via enclosed within the plating resist to produce a terminal layer; and removing the plating resist.

4. The process for producing a printed wiring board for mounting electronic components according to claim 3, further comprising plating an end portion of the filled via on the wiring pattern or conductive metal layer side to cover at least the boundary between the filled via and the wiring pattern or the conductive metal layer.

* * * * *